(12) United States Patent
Horii

(10) Patent No.: US 12,203,169 B2
(45) Date of Patent: Jan. 21, 2025

(54) SUBSTRATE PROCESSING APPARATUS, METHOD OF PROCESSING SUBSTRATE, METHOD OF MANUFACTURING SEMICONDUCTOR DEVICE AND RECORDING MEDIUM

(71) Applicant: KOKUSAI ELECTRIC CORPORATION, Tokyo (JP)

(72) Inventor: Akira Horii, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 527 days.

(21) Appl. No.: 17/565,808

(22) Filed: Dec. 30, 2021

(65) Prior Publication Data

US 2022/0119951 A1   Apr. 21, 2022

Related U.S. Application Data

(63) Continuation of application No. PCT/JP2020/024303, filed on Jun. 22, 2020.

(30) Foreign Application Priority Data

Jul. 1, 2019   (JP) .................... 2019-122797

(51) Int. Cl.
C23C 16/46     (2006.01)
C23C 16/44     (2006.01)
C23C 16/52     (2006.01)

(52) U.S. Cl.
CPC ........ C23C 16/463 (2013.01); C23C 16/4411 (2013.01); C23C 16/52 (2013.01)

(58) Field of Classification Search
CPC ... C23C 16/463; C23C 16/4411; C23C 16/52; H01L 21/67011; H01L 21/02271; H01L 21/205
See application file for complete search history.

(56) References Cited

U.S. PATENT DOCUMENTS 5,530,222 A * 6/1996 Peck ................. C30B 31/10
219/403
2008/0182345 A1   7/2008 Sugishita et al.
(Continued)

FOREIGN PATENT DOCUMENTS

| JP | H03004927 A | 1/1991 |
| JP | H08127861 A | 5/1996 |
| JP | 2011066106 A | 3/2011 |

*Primary Examiner* — Jeffrie R Lund
(74) *Attorney, Agent, or Firm* — Volpe Koenig (57) ABSTRACT

Even when two processing furnaces are included, space can be saved by removing needed equipment. Included are: first and second furnaces that process a substrate; a heat exchanger that cools a refrigerant discharged from the first and second furnaces; an exhaust blower that sucks the refrigerant discharged from the heat exchanger and sends out the refrigerant to a downstream side; first and second flow paths that connect the first and second furnaces, the heat exchanger, and the exhaust blower to each other such that the refrigerant can flow therethrough; first and second dampers having variable opening degrees disposed upstream from the heat exchanger in the first and second flow paths, respectively; and a controller that controls heating and cooling of the first and second furnaces. The first and second flow paths merge together in at least a part of each of the first and second flow paths.

11 Claims, 9 Drawing Sheets

(56) References Cited

U.S. PATENT DOCUMENTS

| | | |
|---|---|---|
| 2008/0271471 A1 | 11/2008 | Nozawa et al. |
| 2009/0029486 A1 | 1/2009 | Ueno et al. |
| 2013/0327363 A1 | 12/2013 | Inadomi et al. |
| 2014/0287375 A1* | 9/2014 | Kosugi .................... F27D 9/00 |
| | | 438/795 |
| 2022/0119951 A1* | 4/2022 | Horii ................... C23C 16/4411 |

* cited by examiner

SUBSTRATE PROCESSING APPARATUS, METHOD OF PROCESSING SUBSTRATE, METHOD OF MANUFACTURING SEMICONDUCTOR DEVICE AND RECORDING MEDIUM

CROSS-REFERENCE TO RELATED APPLICATION

This application is a Bypass Continuation Application of PCT International Application No. PCT/JP2020/024303, filed on Jun. 22, 2020, the international application being based upon and claiming the benefit of priority from Japanese Patent Application No. 2019-122797, filed on Jul. 1, 2019, the entire contents of which are incorporated herein by reference.

TECHNICAL FIELD

This present disclosure relates to a substrate processing apparatus, a method of processing substrate, a method for manufacturing a semiconductor device and a recording medium.

BACKGROUND

As an example of the substrate processing apparatus, there is a semiconductor manufacturing device. Furthermore, as an example of the semiconductor manufacturing device, a vertical diffusion/chemical vapor deposition (CVD) device is known. In this vertical diffusion/CVD device, a substrate such as a semiconductor or glass is processed under heating. For example, a substrate is housed in a vertical processing furnace and heated while a reactive gas is supplied to the processing furnace to grow a thin film in a vapor phase on the substrate. In this type of semiconductor manufacturing device, the temperature inside the furnace, which has become high during film formation or maintenance, is cooled and heat is discharged to the outside of the device main body.

SUMMARY

The above-described substrate processing apparatus includes a radiator and an exhaust blower in order to lower the temperature inside the furnace, which has become high by heating, in a short time. In addition, in order to improve a throughput, a substrate processing apparatus including two processing furnaces may be used. However, when two processing furnaces are included, a radiator and an exhaust blower may be disposed for each of the processing furnaces.

The present disclosure is directed to provide a technique capable of saving space by removing needed equipment even when two processing furnaces are included.

One aspect of this present disclosure provides a technique including: a first and second furnaces in which a substrate is processed; a heat exchanger that cools a refrigerant discharged from the first and second furnace bodies; an exhaust blower that sucks the refrigerant discharged from the heat exchanger and sends out the refrigerant to a downstream side; first and second flow paths that connect the first and second furnace bodies, the heat exchanger, and the exhaust blower to each other such that the refrigerant can flow therethrough; first and second dampers having variable opening degrees disposed upstream from the heat exchanger in the first and second flow paths, respectively; and a controller that controls heating and cooling of the first and second furnace bodies, in which the first and second flow paths merge together in at least a part of each of the first and second flow paths.

BRIEF DESCRIPTION OF DRAWINGS

FIGS. 5A to 5E are cross-sectional views of the processing furnace illustrated in FIG. 4, in which

DETAILED DESCRIPTION

In a present embodiment, a substrate processing apparatus 1 is configured as a vertical substrate processing apparatus that performs a substrate processing step such as heat processing as one step of a manufacturing process in a method for manufacturing a semiconductor device.

Figure 1:
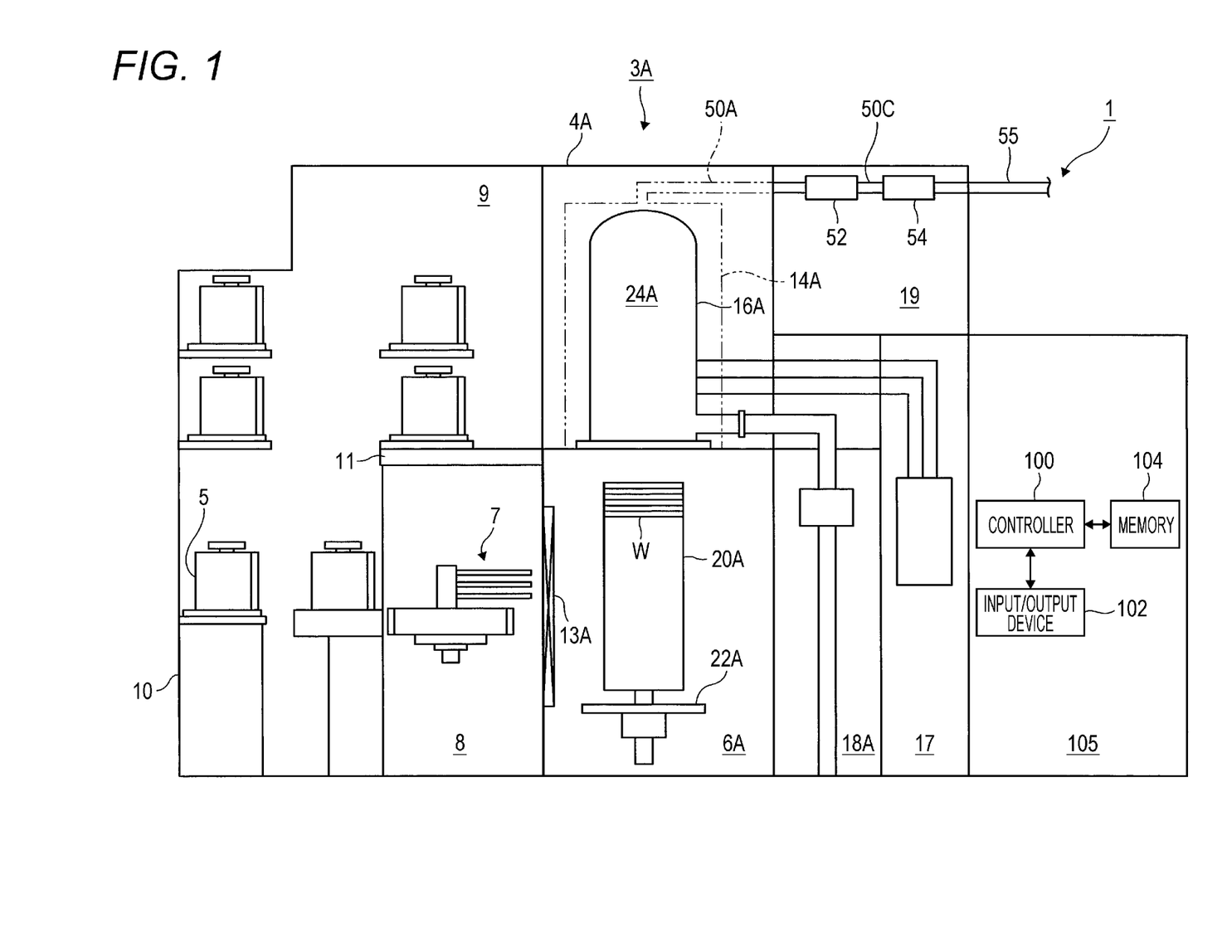
FIG. 1 is a vertical cross-sectional view schematically illustrating a substrate processing apparatus according to an embodiment of this present disclosure.
Figure 2:
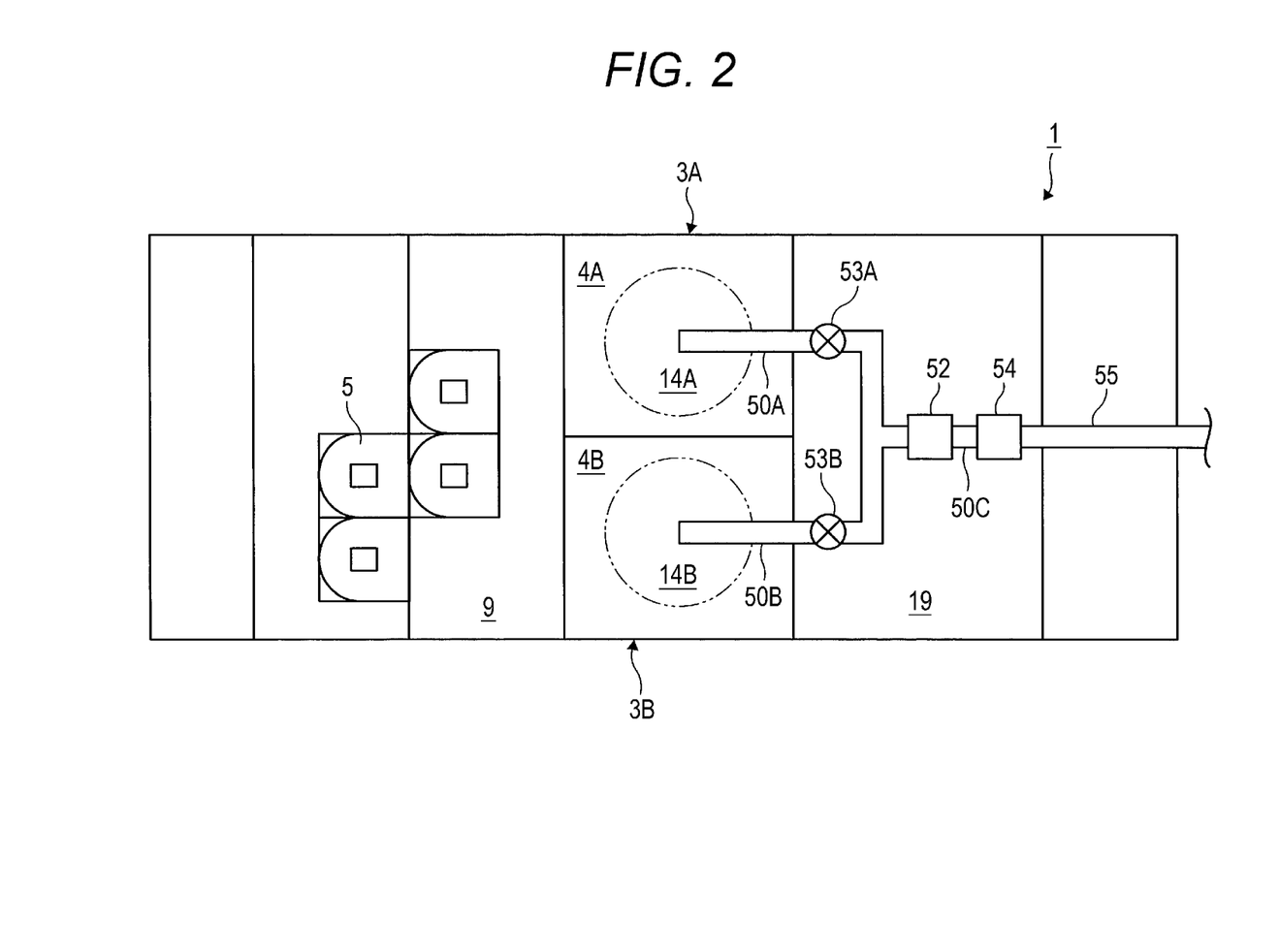
FIG. 2 is a horizontal cross-sectional view schematically illustrating the substrate processing apparatus according to the embodiment of this present disclosure.
Figure 3:
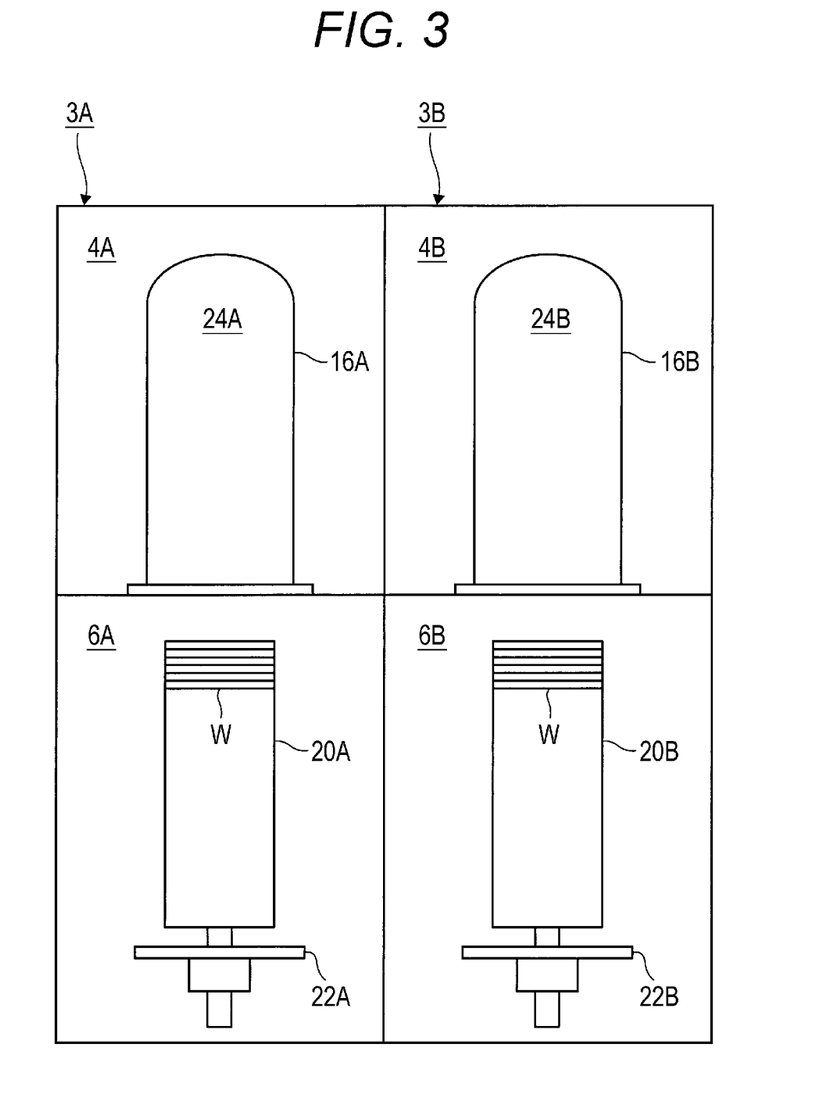
FIG. 3 is a vertical cross-sectional view schematically illustrating the substrate processing apparatus according to the embodiment of this present disclosure.

As illustrated in FIGS. 1 to 3, the substrate processing apparatus 1 includes two adjacent processing modules 3A and 3B. The processing module 3A includes a processing furnace 4A and a loading chamber 6A as a first loading chamber that temporarily houses a wafer W as a substrate to be carried in and out of the processing furnace 4A. The processing module 3B includes a processing furnace 4B and a loading chamber 6B as a second loading chamber that temporarily houses a wafer W to be carried in and out of the processing furnace 4B. The loading chambers 6A and 6B are disposed below the processing furnaces 4A and 4B, respectively. A transfer chamber 8 including a transfer machine 7 that transfers a wafer W is disposed adjacent to a front side of the loading chambers 6A and 6B. A storage chamber 9 that stores a pod (hoop) 5 that stores a plurality of wafers W is connected to a front side of the transfer chamber 8. A load port 10 is disposed on an upper surface or a front surface of the storage chamber 9, and the pod 5 is carried in and out of the substrate processing apparatus 1 via the load port 10.

Gate valves 13A and 13B are disposed on a boundary wall (adjacent surface) between the loading chambers 6A and 6B and the transfer chamber 8, respectively. A pressure detector is disposed in each of the transfer chamber 8 and the loading chambers 6A and 6B, and the pressure in the transfer chamber 8 is set so as to be lower than the pressure in each of the loading chambers 6A and 6B. In addition, an oxygen concentration detector is disposed in each of the transfer chamber 8 and the loading chambers 6A and 6B, and the oxygen concentration in each of the transfer chamber 8 and the loading chambers 6A and 6B is maintained so as to be lower than the oxygen concentration in the atmosphere. As illustrated in FIG. 1, a clean unit 11 that supplies clean air into the transfer chamber 8 is disposed on a ceiling of the transfer chamber 8, and circulates, for example, an inert gas as clean air in the transfer chamber 8. By circulating and purging the inside of the transfer chamber 8 with an inert gas, the inside of the transfer chamber 8 can be made into a clean atmosphere. With such a configuration, it is possible to suppress particles and the like in the loading chambers 6A and 6B from being mixed into the transfer chamber 8, and it is possible to suppress formation of a natural oxide film on a wafer W in the transfer chamber 8 and the loading chambers 6A and 6B.

Transfer of a wafer W to boats 20A and 20B is performed in the loading chambers 6A and 6B through the transfer chamber 8, respectively. The pressure inside each of the loading chambers 6A and 6B is set so as to be lower than the pressure outside the substrate processing apparatus 1.

A gas to be used for substrate processing is supplied into the processing chambers 24A and 24B by a gas supply system described later. The gas supplied by the gas supply system is changed depending on the type of film to be formed. Here, the gas supply system includes a raw material gas supplier, a reactive gas supplier, and an inert gas supplier. The gas supply system is housed in a supply box 17. Note that the supply box 17 is disposed in common for the processing modules 3A and 3B, and therefore regarded as a common supply box.

The gas that has been used for substrate processing is discharged from the processing chambers 24A and 24B by a gas exhaust system described later. The gas exhaust system is housed in each of exhaust boxes 18A and 18B.

A duct 50A as a first flow path and a duct 50B as a second flow path are connected to furnace spaces 14A and 14B of the processing furnaces 4A and 4B, respectively. In addition, the duct 50A and the duct 50B merge together on a downstream side and are connected to a duct 50C as a third flow path. In other words, the duct 50C is a part of the duct 50A and duct 50B where the duct 50A and the duct 50B merge together and flow. In the duct 50C, a radiator 52 as a heat exchanger, an exhaust blower 54, and an factory exhaust duct 55 are disposed in this order from an upstream side. The radiator 52 cools, in a short time, a gaseous refrigerant that has cooled the furnace spaces 14A and 14B and reached a high temperature to a temperature at which the refrigerant can be discharged. In addition, the exhaust blower 54 sucks the refrigerant that has been cooled by the radiator 52 and sends out the refrigerant to the factory exhaust duct 55 on a downstream side. The radiator 52 and the exhaust blower 54 are disposed at substantially the same height toward a rear of the processing furnaces 4A and 4B. The duct 50A, the duct 50B, and the duct 50C connect the furnace space 14A formed inside a heater 12A and the furnace space 14B formed inside a heater 12B to the factory exhaust duct 55 through the radiator 52 and the exhaust blower 54 such that the refrigerant can flow therethrough.

In addition, on upstream sides of the radiator 52 in the middle of the ducts 50A and 50B, a damper 53A as a first damper having a variable opening degree and a damper 53B as a second damper having a variable opening degree are disposed, respectively. The dampers 53A and 53B are preferably disposed in the immediate vicinity of refrigerant outlets of the furnace spaces 14A and 14B, respectively, in order to minimize heat escape. In this example, the ducts 50A and 50B merge into the duct 50C downstream of the dampers 53A and 53B and upstream of the radiator 52 such that both the radiator 52 and the exhaust blower 54 are used commonly for cooling the furnace space 14A and the furnace space 14B.

As illustrated in FIGS. 2 and 3, the components of the processing module 3A, that is, the components in the processing furnace 4A and the components in the loading chamber 6A are disposed bisymmetrically and plane-symmetrically with the components of the processing module 3B, that is, the components in the processing furnace 4B and the components in the loading chamber 6B, respectively, about an adjacent plane (boundary plane) of the processing modules 3A and 3B as a symmetric plane. In addition, as illustrated in FIG. 2, the length of the duct 50A is the same as the length of the duct 50B, the duct 50A and the damper 53A are disposed bisymmetrically with the duct 50B and the damper 53B, respectively, about the duct 50C, and the position of the damper 53A in the duct 50A is substantially the same as the position of the damper 53B in the duct 50B.

The radiator 52 and the exhaust blower 54 used for cooling the furnace spaces 14A and 14B are housed in a cooling box 19. Note that the cooling box 19 is disposed in common for the processing modules 3A and 3B, and therefore regarded as a common cooling box.

To the gas supply system, the gas exhaust system, the carry system, the radiator 52, the exhaust blower 54, the dampers 53A and 53B, and the like, a controller 100 as a controller for controlling these is connected. The controller 100 is constituted by, for example, a microprocessor (computer) including a CPU, and controls operation of the substrate processing apparatus 1. To the controller 100, an input/output device 102 formed as, for example, a touch panel is connected. One controller 100 can be disposed in common for the processing module 3A and the processing module 3B.

A memory 104 may be a memory device (hard disk or flash memory) built in the controller 100, or may be a portable external recording device (for example, a semiconductor memory such as a USB memory or a memory card). In addition, a program may be provided to the computer using a communication means such as a network. The program is read from the memory 104 by an instruction or the like from the input/output device 102 as needed, and the controller 100 executes a process according to a read recipe. As a result, the substrate processing apparatus 1 executes a desired process under control of the controller 100. The controller 100 is housed in a controller box 105. An instruction to start the recipe can be given from the outside for each processing module at a random timing.

The controller 100 can control opening/closing operation of the dampers 53A and 53B such that the cooling timing of the processing furnace 4A does not overlap with the cooling timing of the processing furnace 4B. For example, the controller 100 opens the damper 53A of the processing furnace 4A on a cooling side, closes the damper 53B of the processing furnace 4B on a non-cooling side, and switches between cooling the furnace space 14A and cooling the furnace space 14B. For this reason, the controller 100 predicts the timings of opening the dampers 53A and 53B next, and adjusts start times of recipes performed in the processing module 3A and the processing module 3B such that the open periods of the dampers 53A and 53B do not overlap with each other or even if the open periods of the dampers 53A and 53B overlap with each other, there is such a time difference that the temperature of a processing furnace of a processing module having a damper to be opened first is lowered to a predetermined temperature or lower when a damper to be opened later is opened. That is, the timings for heat processing are made different. For example, the recipes for the processing modules can proceed in opposite phases to each other. In addition, at an end of rapid cooling of the preceding recipe, the temperature of the refrigerant is low, and therefore partial overlap between the rapid cooling periods may be allowed. Adjustment of the start of the recipe is rarely needed, and independence between the processing modules is maintained to such an extent that an interfere with practical use does not occur.

Note that instead of the dampers 53A and 53B, a three-way valve may be disposed at a merging point of the ducts 50A and 50B. As the three-way valve, a valve that not only connects any two ports of the three ports to each other but also can communicate the three ports with each other at the same time and can close the three ports at the same time can be used. In this case as well, the recipes for the two processing furnaces 4A and 4B proceed such that a period during which the three ports communicate with each other at the same is 0 or sufficiently shorter than a rapid cooling period. By using the three-way valve instead of the dampers 53A and 53B, the number of parts can be reduced, and space saving and energy saving (cost reduction) can be achieved. In addition to the dampers 53A and 53B, the three-way valve may be further disposed. As a result, the duct 50A and the duct 50B can be selectively connected to the radiator 52 on downstream sides of the damper 53A and the damper 53B such that a refrigerant can flow therethrough.

The processing furnace 4A and the processing furnace 4B have the same configuration, and therefore will be described below as the processing furnace 4.

Figure 4:
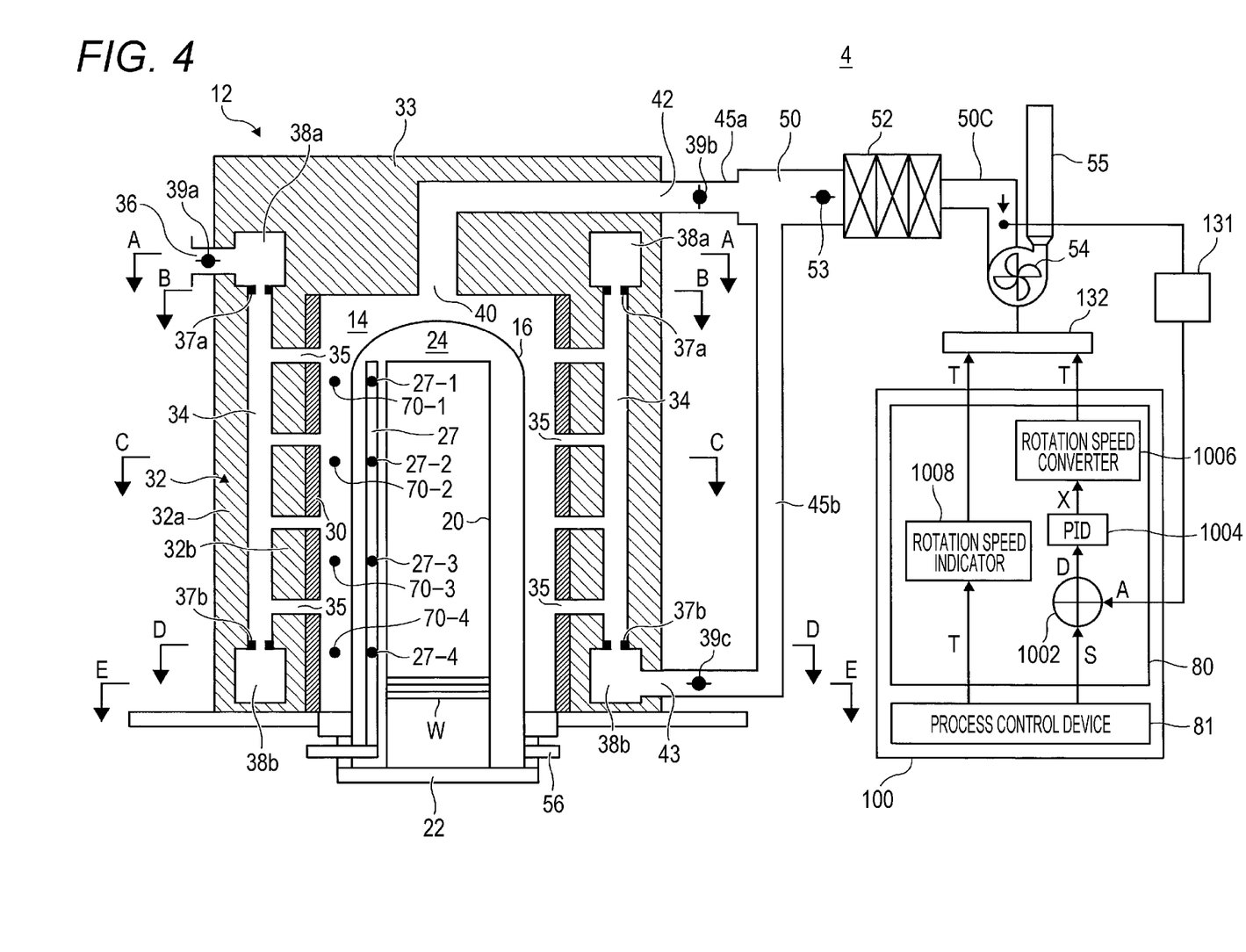
FIG. 4 is a vertical cross-sectional view schematically illustrating a processing furnace according to the embodiment of this present disclosure.

As illustrated in FIG. 4, the processing furnace 4 includes the heater 12 as a cylindrical furnace body, a cylindrical reaction tube 16 housed in the furnace space 14 inside the heater 12, and the boat 20 that holds a wafer W to be processed in the reaction tube 16. The boat 20 can be loaded with wafers W in multiple stages with gaps in a horizontal state, and holds the plurality of wafers W in the reaction tube 16 in this state. The boat 20 is placed on an elevator (not illustrated) via a boat cap 22, and can be raised and lowered by this elevator. Therefore, loading of a wafer W into the reaction tube 16 and removal of a wafer W from the reaction tube 16 are performed by operation of the elevator. In addition, the reaction tube 16 forms the processing chamber 24 that houses a wafer W, a gas introduction tube (not illustrated) communicates with the inside of the reaction tube 16, and the gas supply system is connected to the gas introduction tube. In addition, a gas exhaust pipe 56 communicates with the inside of the reaction tube 16 to exhaust the inside of the processing chamber 24.

The heater 12 has a cylindrical shape and has a heat insulating structure in which a plurality of heat insulating bodies is laminated and a heating elements 30 as a heat-generating body that heat the furnace space 14 inside the heat insulating structure. The heating elements 30 is disposed inside the heater 12 by being divided into a plurality of zones. The heater 12 heats a wafer W inside the heater 12 to perform heat processing on the wafer W.

The heat insulating structure has a side wall 32 as a heat insulator formed into a cylindrical shape, and an upper wall 33 as a heat insulator formed so as to cover an upper end of the side wall 32.

The side wall 32 is formed into a multilayer structure, and includes a side wall outer layer 32a formed on an outer side of the plurality of layers of the side wall 32 and a side wall inner layer 32b formed on an inner side of the plurality of layers. A cylindrical space 34 as a refrigerant passage is formed between the side wall outer layer 32a and the side wall inner layer 32b. The heating elements 30 is disposed inside the side wall inner layer 32b, and the inside of the heating elements 30 serves as a furnace core. Furthermore, the side wall 32 has a structure in which a plurality of heat insulating bodies is laminated, but it goes without saying that the side wall 32 is not limited to such a structure.

In a side portion of the upper wall 33 or an upper portion of the side wall outer layer 32a, a refrigerant supply port 36 that supplies a refrigerant such as air to the inside of the processing furnace 4 (the inside of the heater 12) is formed. In addition, in a lower portion of the side wall outer layer 32a, a refrigerant discharge port 43 that discharges a refrigerant from the inside of the processing furnace 4 (the inside of the heater 12) is formed.

Figure 5A:
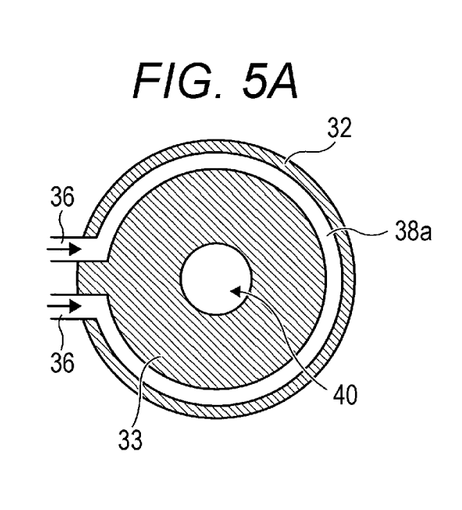
FIG. 5A is a cross-sectional view taken along line A-A.

As illustrated in FIG. 5A, a duct 38a as a buffer area communicating with the refrigerant supply port 36 and the cylindrical space 34 is disposed at an upper end of the cylindrical space 34 in a substantially horizontal direction of the refrigerant supply port 36. In the present embodiment, the refrigerant supply port 36 is disposed in an annular shape, but it goes without saying that the embodiment of the present disclosure is not limited to this form. A circular rapid cooling exhaust port 40 is formed on the central axis of the heater 12 on the upper wall 33, and the rapid cooling exhaust port 40 is open to the furnace space 14. In addition, a refrigerant discharge port 42 is formed on a side surface of the upper wall 33 above the duct 38a, and communicates with the rapid cooling exhaust port 40.

Figure 5B:
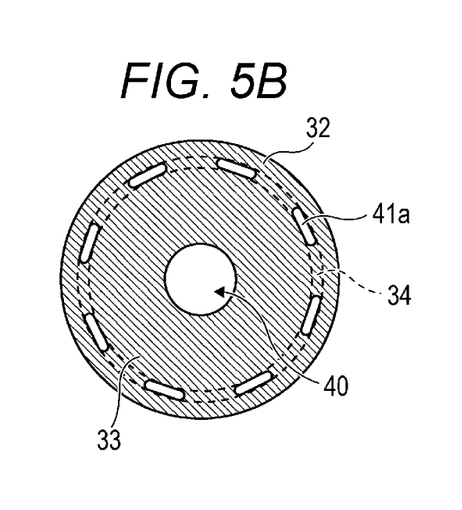
FIG. 5B is a cross-sectional view taken along line B-B.
Figure 5C:
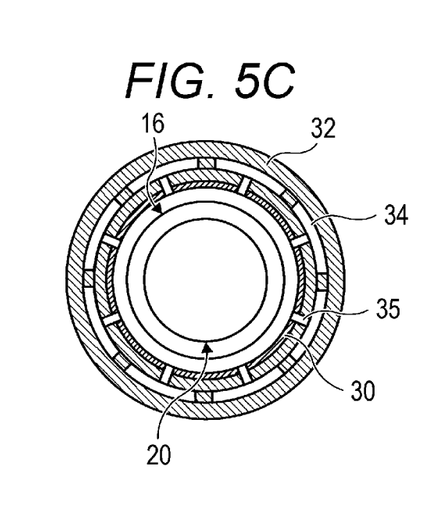
FIG. 5C is a cross-sectional view taken along line C-C.
Figure 5D:
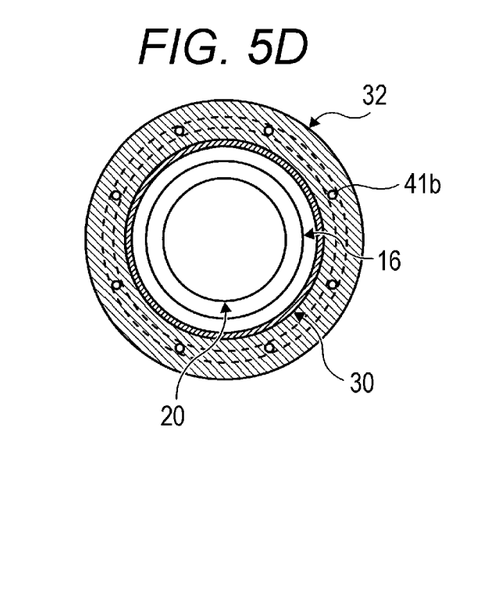
FIG. 5D is a cross-sectional view taken along line D-D.
Figure 5E:
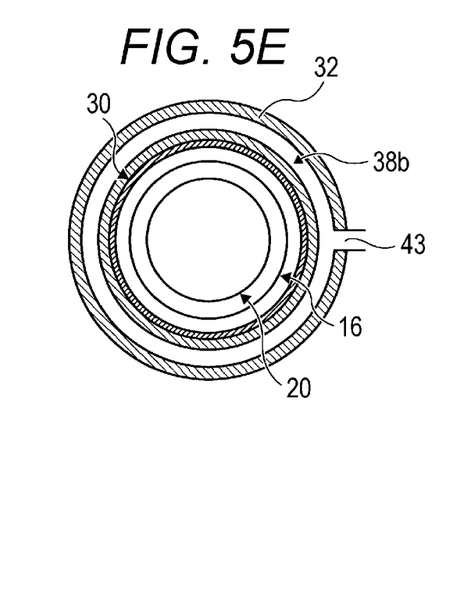
FIG. 5E is a cross-sectional view taken along line E-E.

As illustrated in FIG. 5E, a duct 38b as a buffer area communicating with the refrigerant discharge port 43 and the cylindrical space 34 is disposed at a lower end of the cylindrical space 34 in a substantially horizontal direction of the refrigerant discharge port 43. The duct 38b has an annular shape and is formed so as to have a wider cross-sectional area than the cross-sectional area of each of the refrigerant discharge port 43 and the cylindrical space 34.

That is, ducts 38a and 38b as buffer areas formed so as to be wider than the cylindrical space 34 are disposed at both ends of the cylindrical space 34.

In addition, at a boundary between the duct 38a and the cylindrical space 34, a throttle 37a is disposed which narrows the refrigerant passage which is the cylindrical space 34 (reduces the cross-sectional area of the refrigerant passage) to reduce a flow rate of a refrigerant. That is, at the boundary plane between the duct 38a and the cylindrical space 34, as illustrated in FIG. 5B, a plurality of throttle holes 41a is evenly formed in a circumferential direction.

In addition, at a boundary between the duct 38b and the cylindrical space 34, a throttle 37b is disposed which narrows the refrigerant passage which is the cylindrical space 34 (reduces the cross-sectional area of the refrigerant passage) to reduce a flow rate of a refrigerant. That is, at the boundary plane between the duct 38b and the cylindrical space 34, as illustrated in FIG. 5D, a plurality of throttle holes 41b is evenly formed in a circumferential direction.

In addition, the cross-sectional area of the throttle hole 41a is larger than the cross-sectional area of the throttle hole 41b. In addition, the total cross-sectional area of the plurality of throttle holes 41a is smaller than each of the cross-sectional areas of the ducts 38a and 38b.

In addition, as illustrated in FIG. 5C, in the side wall inner layer 32b below the refrigerant supply port 36, a plurality of blowout holes 35 communicating the cylindrical space 34 and the furnace space 14 with each other is formed in a desired distribution, and as illustrated in FIG. 4, communicates the cylindrical space 34 and the furnace space 14 with each other substantially horizontally. That is, a refrigerant is blown out from the cylindrical space 34 to the furnace space 14.

In addition, the refrigerant discharge port 42 and the refrigerant discharge port 43 are connected to the exhaust pipes 45a and 45b, respectively, and merge into the duct 50. Specifically, the exhaust pipes 45a and 45b of the processing furnaces 4A and 4B merge into the ducts 50A and 50B, respectively. Then, the duct 50A and the duct 50B merge into the duct 50C. The radiator 52 and the exhaust blower 54 are connected to the duct 50C in this order from an upstream side, and the factory exhaust duct 55 is connected to the exhaust blower 54. A heated refrigerant in the heaters 12A and 12B is discharged via the ducts 50, the radiator 52, the exhaust blower 54, and the factory exhaust duct 55 to the outside of a clean room where the substrate processing apparatus 1 is disposed.

Here, a damper 39a, which is a valve that can be opened and closed, is disposed near the refrigerant supply port 36 in the duct 38a. In addition, a damper 39b that can be opened and closed is disposed near the refrigerant discharge port 42 and the duct 50 in the duct 50. In addition, a damper 39c that can be opened and closed is disposed near the refrigerant discharge port 43 and the duct 38b. Then, by disposing the dampers 39b and 39c near the duct 50 or the duct 38b, an influence of convection from the duct at a discharge port when not in use can be reduced, and substrate temperature uniformity around the duct can be improved.

Furthermore, supply of a refrigerant is operated by opening/closing the damper 39a and turning on/off the exhaust blower 54, the cylindrical space 34 is closed and opened by opening/closing the damper 39b or the damper 39c and turning on/off the exhaust blower 54, and a refrigerant is discharged from the refrigerant discharge port 42 or the refrigerant discharge port 43.

In addition, on a downstream side of the radiator 52 of the duct 50C and on an upstream side of the exhaust blower 54, a pressure sensor 131 that detects the pressure on an upstream side of the exhaust blower 54 is disposed.

An exhaust blower control device 80 includes a subtractor 1002, a PID calculator 1004, a rotation speed converter 1006, and a rotation speed indicator 1008. A pressure target value S is input from a process control device 81 to the subtractor 1002. In addition to the pressure target value S, a pressure value A measured by the pressure sensor 131 is input to the subtractor 1002, and a deviation D obtained by subtracting the pressure value A from the pressure target value S is output from the subtractor 1002. Here, the pressure target value S is such a value that an intake side of the exhaust blower 54 maintains a predetermined negative pressure as compared with the atmospheric pressure.

The deviation D is input to the PID calculator 1004. The PID calculator 1004 performs PID calculation based on the input deviation D, and calculates an operation amount X.

The calculated operation amount X is input to the rotation speed converter 1006, converted to a rotation speed T by the rotation speed converter 1006, and output. The output rotation speed T is input to an inverter 132, and the rotation speed of the exhaust blower 54 is changed.

The pressure value A from the pressure sensor 131 is input to the subtractor 1002 at all times or at predetermined time intervals, and control of the rotation speed of the exhaust blower 54 is continued such that the deviation D between the pressure target value S and the pressure value A is 0 based on this pressure value A. As described above, the rotation speed of the exhaust blower 54 is controlled via the inverter 132 such that the deviation D between the pressure value A measured by the pressure sensor 131 and the predetermined pressure target value S disappears. A fact that the pressure A indicated by the pressure sensor 131 is higher than the pressure target value S indicates some abnormality, and the pressure A can be inspected on a daily basis.

Instead of calculating the rotation speed T with the PID calculator 1004, by inputting the rotation speed T from the process control device 81 to the rotation speed indicator 1008, and inputting the rotation speed T from the rotation speed indicator 1008 to the inverter 132, the rotation speed of the exhaust blower 54 may be changed. In addition, instead of the pressure sensor 131, a flow velocity sensor may be used to control a flow rate in the duct 50C so as to be constant.

Figure 6:
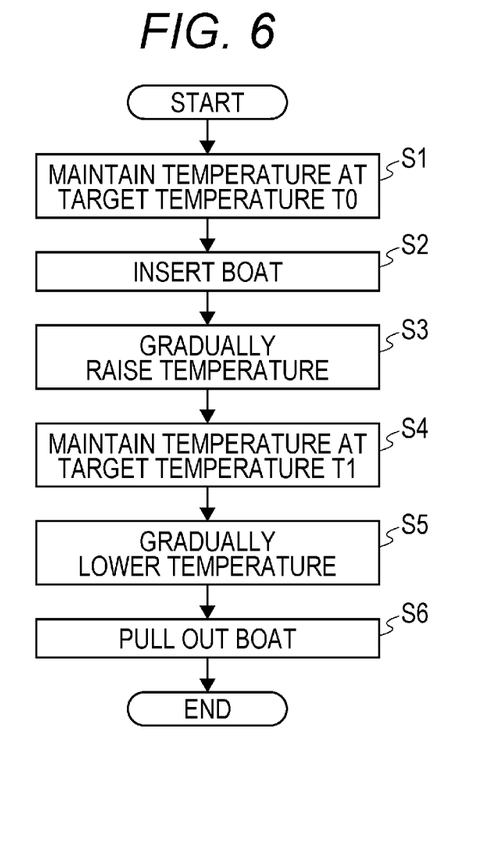
FIG. 6 is a diagram illustrating a flowchart indicating an example of a temperature-related process among film forming processes according to the embodiment of this present disclosure.
Figure 7:
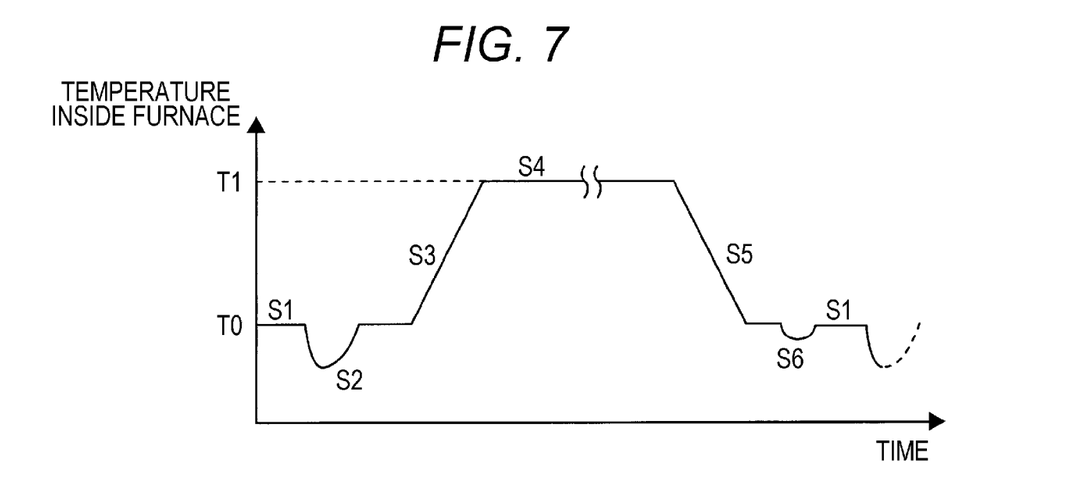
FIG. 7 is a diagram illustrating a temperature change inside the furnace in the flowchart illustrated in FIG. 6.

Next, an example of a film forming process performed in the processing furnace 4 will be described with reference to FIGS. 6 and 7. FIG. 6 is a flowchart indicating an example of a temperature-related process among film forming processes performed in the processing furnace 4, and FIG. 7 schematically illustrates a temperature change inside the furnace. Reference numerals S1 to S6 illustrated in FIG. 7 indicate that steps S1 to S6 in FIG. 6 are performed, respectively.

Step S1 is a process of stabilizing the temperature inside the furnace to a relatively low temperature T0. In step S1, a wafer W has not been inserted into the furnace yet.

Step S2 is a process of inserting a wafer W held by the boat 20 into the furnace. Since the temperature of the wafer W is lower than the temperature T0 inside the furnace at this point, the temperature inside the furnace is temporarily lower than T0 as a result of inserting the wafer W into the furnace. However, the temperature inside the furnace is stabilized again at the temperature T0 by a temperature control device 74 or the like described later after a short period of time.

Step S3 is a process of raising the temperature inside the furnace at a constant rate from the temperature T0 to a target temperature T1 for performing a film forming process on the wafer W.

Step S4 is a process of maintaining and stabilizing the temperature inside the furnace at the target temperature T1 in order to perform a film forming process on the wafer W.

Step S5 is a process of lowering the temperature inside the furnace at a constant rate from the temperature T1 to the relatively low temperature T0 again after the film forming process is completed.

Step S6 is a process of pulling out the wafer W that has been subjected to the film forming process together with the boat 20 from the inside of the furnace.

When an unprocessed wafer W to be subjected to the film forming process remains, the processed wafer W on the boat 20 is replaced with the unprocessed wafer W, and the series of processes in steps S1 to S6 are repeated.

Each of the processes in steps S1 to S6 obtains a stable state in which the temperature inside the furnace is within a predetermined minute temperature range with respect to a target temperature and the state continues only for a predetermined time, and then proceeds to a next step. Alternatively, recently, each of the processes in S1, S2, S5, S6, and the like proceeds to a next step without obtaining a stable state in order to increase the number of wafers W to be subjected to a film forming process in a certain period of time.

In the reaction tube 16, first temperature sensors 27-1, 27-2, 27-3, and 27-4 that detect the temperature of the substrate are disposed in parallel with the boat 20 in order from an upper part in the reaction tube 16. The first temperature sensors 27-1, 27-2, 27-3, and 27-4 are used as substrate temperature sensors that detect temperatures corresponding to the temperatures of wafers W in heater zones U, CU, CL, L from above the heater 12, respectively.

In addition, in the furnace space 14, second temperature sensors 70-1, 70-2, 70-3, and 70-4 that detect a heater temperature are disposed in parallel with the reaction tube 16 in order from above in the furnace space 14. The second temperature sensors 70-1, 70-2, 70-3, and 70-4 are used as heater temperature sensors that detect temperatures corresponding to the temperatures of the furnace space or the heating elements 30 in the heater zones U, CU, CL, and L from above the heater 12, respectively.

Next, a process when the temperature inside the furnace is suitable will be described.

When the temperature inside the furnace is suitable and stable, all of the dampers 39a, 39b, and 39c are closed and the exhaust blower 54 is also stopped (furnace temperature stable control state). At this time, a refrigerant in the cylindrical space 34, which is a refrigerant passage, is in a stationary state having a high energy saving effect. That is, it is in a state of step S4 (during film forming process for a wafer W) in FIGS. 6 and 7.

Next, a rapid cooling process for rapidly cooling the inside of the furnace will be described.

At the time of rapid cooling, the damper 39c is closed, the damper 39a is opened, and the damper 39b is opened to operate the exhaust blower 54 (rapid cooling control state). A refrigerant supplied from the refrigerant supply port 36 is uniformized at the throttle 37a via the duct 38a and then introduced into the cylindrical space 34. The refrigerant introduced into the cylindrical space 34 descends in the cylindrical space 34 and is introduced into the furnace space 14 via the blowout hole 35. The refrigerant introduced into the furnace space 14 rises in the furnace space 14, is discharged from the refrigerant discharge port 42 via the rapid cooling exhaust port 40, and cools the heating elements 30 from both an outer surface and an inner surface. That is, the heated refrigerant in the heater 12 is discharged to the outside via the refrigerant discharge port 42 to lower the temperature in the heater 12. That is, it is in a state of step S5 (after film forming process of a wafer W and before boat unloading) in FIGS. 6 and 7. Such a rapid cooling process can be executed at the time of cooling a wafer after the film forming process is completed, at the time of boat unloading, at the time of wafer discharge, at the time of forcibly peeling and removing a deposited film, and the like. A temperature falling rate of the rapid cooling process is equal to or more than 5 times that of natural cooling, for example, 15° C./min or more.

Next, a process for recovering the temperature inside the furnace will be described.

At the time of temperature recovery, the damper 39b is closed, the damper 39a is opened, and the damper 39c is opened to operate the exhaust blower 54 (control state at the time of temperature recovery). A refrigerant supplied from the refrigerant supply port 36 is uniformized in the throttle 37a via the duct 38a, then supplied to the cylindrical space 34, uniformized in the throttle 37b without passing through the furnace space 14 or the rapid cooling exhaust port 40, and then discharged from the refrigerant discharge port 43 via the duct 38b. As described above, by cooling the side wall 32 while the heating elements 30 generate Joule heat, a peak of a radiation spectrum in the heater 12 is shifted to a high temperature side, and a wafer W at a furnace core is effectively heated.

The temperature control device 74 controls opening/closing of the dampers 39a, 39b, and 39c by a damper control device 82 and rotation of the exhaust blower 54 by the exhaust blower control device 80 according to the above-described temperature control modes such as the furnace temperature stable control state, the rapid cooling control state, and the control state at the time of temperature recovery. As a result, it is possible to achieve both temperature recovery characteristics and reduction of power consumption while favorable substrate temperature uniformity is maintained. That is, the controller 100 controls heating of the heating elements 30 in the heater zones U, CU, CL, and L by the heater drive devices 76-1 to 76-4, opening/closing of the dampers 39a, 39b, and 39c by the damper control device 82, opening/closing of the dampers 53A and 53B by the damper control device 82, rotations of the radiator 52 and the exhaust blower 54, and the like such that a wafer W is subjected to heat processing at an independent timing in each of the heaters 12A and 12B. That is, the controller 100 adjusts the opening degrees of the dampers 39b and 39c in the heaters 12A and 12B, and cools the heaters 12A and 12B having different temperatures at a common predetermined temperature falling rate.

Figure 8:
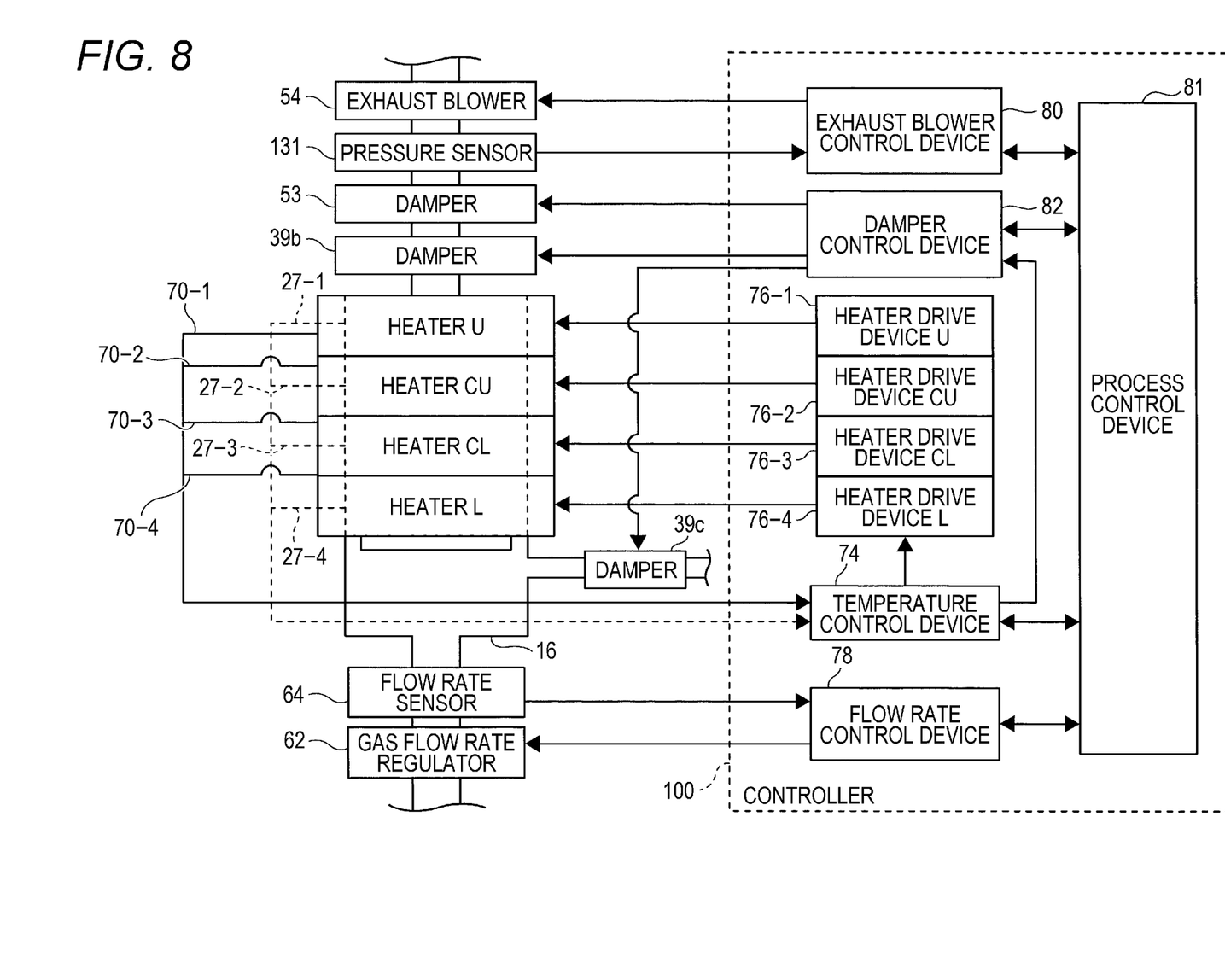
FIG. 8 is a diagram schematically illustrating a configuration of a controller in the substrate processing apparatus according to the embodiment of this present disclosure and a relationship between the controller and the substrate processing apparatus.

FIG. 8 is a diagram schematically illustrating a configuration of the controller 100 that controls the substrate processing apparatus 1 and a relationship between the controller 100 and the processing furnace 4.

As illustrated in FIG. 8, the controller 100 includes a flow rate control device 78, the temperature control device 74, the heater drive devices 76-1, 76-2, 76-3, and 76-4, the exhaust blower control device 80, the damper control device 82, and the process control device 81.

The flow rate control device 78 adjusts the flow rate of a gas supplied into the processing chamber 24 by the gas flow rate regulator 62 based on a detection result by the flow rate sensor 64. The gas flow rate regulator 62 adjusts the flow rate of a gas introduced into the reaction tube 16 via a gas introduction nozzle (not illustrated). The flow rate sensor 64 measures the flow rate of the gas supplied into the reaction tube 16 via the gas introduction nozzle.

The temperature control device 74 divides the heater 12 into four regions of the heater zones U, CU, CL, and L from above, and controls the heater drive devices 76-1, 76-2, 76-3, and 76-4 corresponding to the heater zones U, CU, CL, and L, respectively. Specifically, the temperature control device 74 controls the heater drive device 76-1 based on detection temperatures detected by the first temperature sensor 27-1 and the second temperature sensor 70-1 disposed in the heater zone U. The other zones are controlled similarly.

The damper control device 82 controls the opening degrees of the dampers 39a, 39b, and 39c and opening/closing of the dampers 53A and 53B according to a temperature control mode (recipe) determined by the process control device 81. In addition, in a predetermined temperature control mode other than the rapid cooling control state, the damper control device 82 controls the damper 39b and the like using an opening degree provided by the temperature control device 74.

The exhaust blower control device 80 controls the rotation speed of the exhaust blower 54 based on a pressure value detected by the pressure sensor 131.

Figure 9:
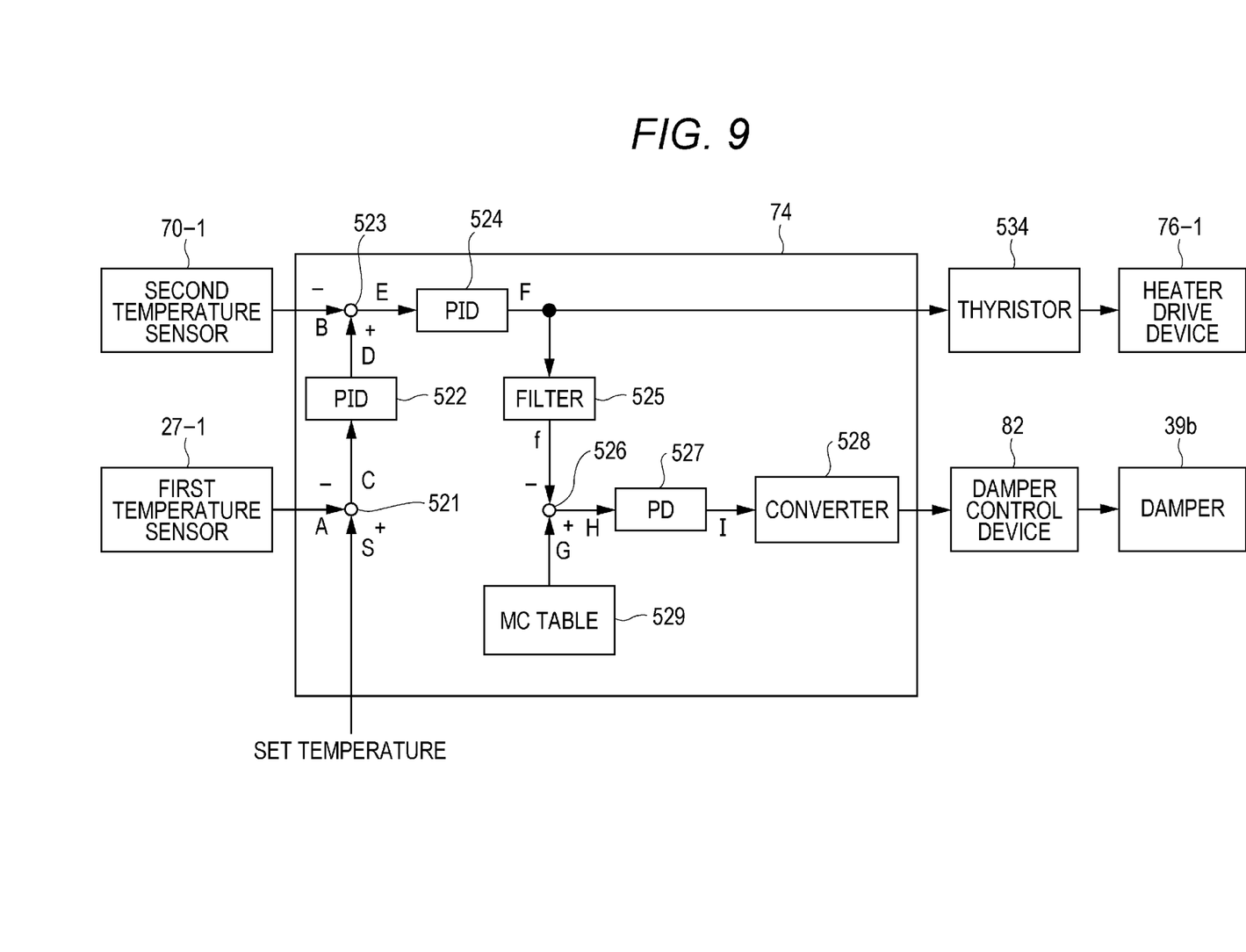
FIG. 9 is a diagram for describing a configuration of a temperature control device in the substrate processing apparatus according to the embodiment of this present disclosure.

The controller 100 controls each component of the semiconductor manufacturing device as the substrate processing apparatus 1 based on a temperature and values of pressure and flow rate set by the memory 104 or the input/output device 102 with these components. As a control method performed inside the controller 100, so-called cascade control as illustrated in FIG. 9 is usually used. In FIG. 8, a method for calculating a control output inside of the temperature control device 74 is illustrated in a block diagram. A target temperature obtained from the process control device 81 is input to an input terminal S.

Next, a control method performed inside the temperature control device 74 will be described with reference to FIG. 9. Note that each of a set temperature, an input terminal S, an input terminal A, an input terminal B, and an output terminal F is present for the number of the first temperature sensors 27-1, 27-2, 27-3, and 27-4. Set temperatures in the heater zones U, CU, CL, and L are input from the process control device 81 to the input terminals S, respectively. Substrate temperatures obtained from the first temperature sensors 27-1, 27-2, 27-3, and 27-4 are input to the input terminals A, respectively. Heater temperatures obtained from the second temperature sensors 70-1, 70-2, 70-3, and 70-4 are input to the input terminals B, respectively.

FIG. 9 illustrates a cascade control loop for the heater zone U.

The temperature control device 74 includes a subtractor 521, a PID calculator 522, a subtractor 523, a PID calculator 524, a filter 525, a subtractor 526, a PD calculator 527, a converter 528, and a reference table 529.

A set temperature S of the heater zone U is input to the subtractor 521 from the process control device 81. In addition to the set temperature S, a detection temperature A detected by the first temperature sensor 27-1 is input to the subtractor 521, and a deviation C obtained by subtracting the detection temperature A from the set temperature S is output by the subtractor 521.

The deviation C is input to the PID calculator 522. The PID calculator 522 performs PID calculation based on the input deviation C, and calculates an operation amount D. The calculated operation amount D is input to the subtractor 523.

A detection temperature B detected by the second temperature sensor 70-1 is input to the subtractor 523, and a deviation E obtained by subtracting the detection temperature B from a target temperature with respect to a heater temperature based on the operation amount D is output by the subtractor 523.

The deviation E is input to the PID calculator 524. The PID calculator 524 performs PID calculation based on the input deviation E, and calculates an operation amount F.

The calculated operation amount F is input to the heater drive device 76-1. The heater drive device 76-1 adjusts a conduction angle of a thyristor based on the input operation amount F, and controls the amount of power (supply power) to the heating elements 30 in the heater zone U.

Similarly, the heater drive devices 76-2, 76-3, and 76-4 control the amount of power (supply power) to the heating elements 30 in the heater zones CU, CL, and L based on the operation amount F calculated by using the set temperatures, the input terminals S, the input terminals A, and the input terminals B in the heater zones CU, CL, and L, respectively.

In addition, the operation amount F is input to the subtractor 526 via the filter 525. The filter 525 is a filter that smooths the operation amount F in a time domain and outputs the smoothed amount as an operation amount f, and can calculate a smoothed value based on the operation amount F for one cycle or more at a resonance frequency of a control system. Note that when a negative operation amount F is input, the operation amount f of 0 may be output immediately. A reference quantity G is input to the subtractor 526 from the reference table 529.

The reference table 529 stores the operation amount F in a stable state, for example, for each zone and each set temperature, and outputs the operation amount F as a reference amount. Note that the reference amount can be continuously adjusted so as to converge rapidly according to a state such as the furnace temperature stable control state, a temperature elevating state at a constant rate, a temperature falling state at a constant rate, or a transition state between these states. For example, when a state transits from the temperature elevating state at a constant rate to the furnace temperature stable control state, the reference amount can be temporarily reduced in order to improve responsiveness by performing heating and cooling at the same time. In addition, in the furnace temperature stable control state, the reference amount can be set to a large value such that cooling does not easily operate.

A deviation H obtained by subtracting the operation amount f from the reference quantity G is output by the subtractor 526. A positive deviation H suggests that the heater should be cooled.

The deviation H is input to the PD calculator 527. The PD calculator 527 performs PD calculation based on the input deviation H, and calculates an operation amount I.

The calculated operation amount I is converted into the opening degree of the damper 39b by the converter 528. Note that a negative operation amount I is converted to 0 (fully closed), and an operation amount I equal to or more than a predetermined value is converted to fully open. Then, the damper control device 82 controls the opening degree of the damper 39b based on the converted opening degree.

In this example, the opening degree of the damper 39b uses the operation amount F in the heater zone U to the heating elements 30 as a control amount, but may use an operation amount in another heater zone. For example, a weighted average value of the operation amounts F in the heater zones U, CU, CL, and L to the heating elements 30 may be used as a control amount. Note that an actual operation amount (supply power) in the heater zone U to the heating elements 30 is a non-negative value, but the operation amount F can also be negative.

As described above, the controller 100 can control, for each of the heater zones U, CU, CL, and L, the heat generation amount of the heating elements 30 in each of the heater zones while referring to the detected temperatures of the second temperature sensor 70-1 to 70-4 such that the detected temperatures of the first temperature sensors 27-1 to 27-4 follow target values. In addition, at the time of rapid cooling or the like, the controller 100 can adjust the opening degrees of the damper 39b and the damper 39c with reference to the detected temperatures of the second temperature sensors 70-1 and 70-4 such that the detected temperatures of the first temperature sensors 27-1 to 27-4 follow target values.

MODIFICATION EXAMPLE

Some Modification Examples will be described below.

Modification Example 1

Figure 10A:
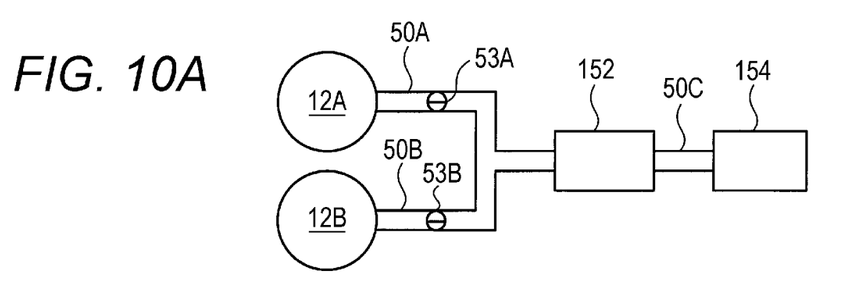
FIGS. 10A to 10C are diagrams schematically illustrating Modification Examples of the substrate processing apparatus according to the embodiment of this present disclosure.

FIG. 10A is a top view schematically illustrating an example of heaters 12A and 12B of a substrate processing apparatus according to Modification Example 1.

As illustrated in FIG. 10A, ducts 50A and 50B are connected to the insides of the heaters 12A and 12B, respectively. In addition, the duct 50A and the duct 50B merge together on a downstream side and are connected to a duct 50C. In the duct 50C, a high-performance radiator 152 and a high-performance exhaust blower 154 are disposed in this order from an upstream side. In addition, on an upstream side of the radiator 152 in the middle of the ducts 50A and 50B, dampers 53A and 53B having variable opening degrees are disposed, respectively. That is, the ducts 50A and 50B merge into the duct 50C, and both the high-performance radiator 152 and the high-performance exhaust blower 154 are commonly used for rapid cooling the heaters 12A and 12B. In this Modification Example, by using the high-performance radiator 152 and the high-performance exhaust blower 154, the dampers 53A and 53B can be opened at the same time, and the heaters 12A and 12B can be rapidly cooled at the same time. At this time, it is preferable to use a radiator 152 or the like having sufficient performance such that a desired temperature falling rate can be obtained without fully opening the damper 53A and the damper 53B. As a result, it is not needed to adjust start time of a recipe, and independence between processing modules 3A and 3B is guaranteed. In addition, for example, even when the damper 53A is opened, the damper 53B is closed, and only the heater 12A is rapidly cooled, rapid cooling time can be shortened.

Modification Example 2

Figure 10B:
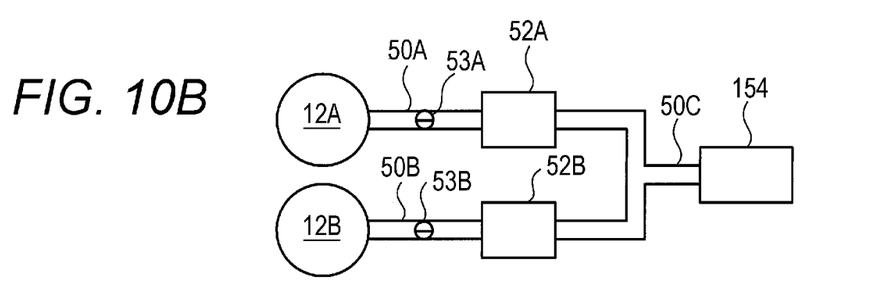

FIG. 10B is a top view schematically illustrating an example of heaters 12A and 12B of a substrate processing apparatus according to Modification Example 2.

As illustrated in FIG. 10B, ducts 50A and 50B are connected to the insides of the heaters 12A and 12B, respectively. In addition, the duct 50A and the duct 50B merge together on a downstream side and are connected to a duct 50C. In the duct 50C, a high-performance exhaust blower 154 is disposed. In addition, radiators 52A and 52B are disposed in the ducts 50A and 50B, respectively. In addition, on upstream sides of the radiators 52A and 52B in the middle of the ducts 50A and 50B, dampers 53A and 53B having variable opening degrees are disposed, respectively. That is, the ducts 50A and 50B merge into the duct 50C, and the high-performance exhaust blower 154 is commonly used for rapid cooling the heaters 12A and 12B. In this Modification Example, by using the high-performance exhaust blower 154, the dampers 53A and 53B can be opened at the same time, and the heaters 12A and 12B can be rapidly cooled in parallel.

Modification Example 3

Figure 10C:
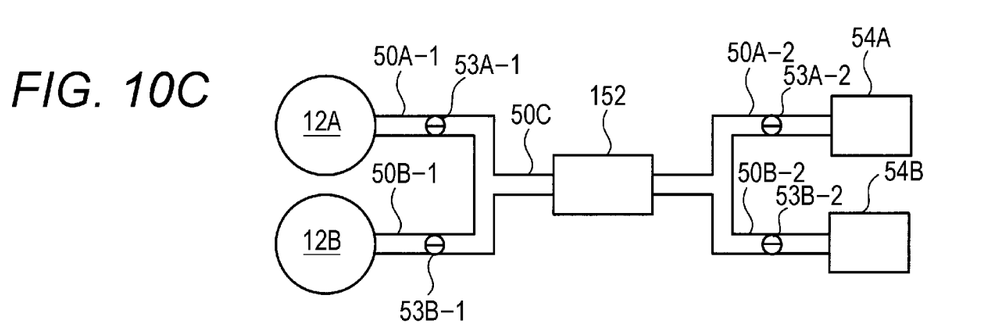

FIG. 10C is a top view schematically illustrating an example of heaters 12A and 12B of a substrate processing apparatus according to Modification Example 3.

As illustrated in FIG. 10C, ducts 50A and 50B are connected to the heaters 12A and 12B, respectively. In addition, the duct 50A and the duct 50B merge together in the middle and are connected to a duct 50C. The duct 50A includes a duct 50A-1 on an upstream side of the duct 50C and a duct 50A-2 on a downstream side of the duct 50C. The duct 50B includes a duct 50B-1 on an upstream side of the duct 50C and a duct 50B-2 on a downstream side of the duct 50C. In the ducts 50A-1 and 50B-1, dampers 53A-1 and 53B-1 having variable opening degrees are disposed, respectively. In the ducts 50A-2 and 50B-2, exhaust blowers 54A and 54B are disposed, respectively. On upstream sides of the exhaust blowers 54A and 54B of the ducts 50A-2 and 50B-2, dampers 53A-2 and 53B-2 having variable opening degrees are disposed, respectively. In the duct 50C, a high-performance radiator 152 is disposed. That is, the ducts 50A and 50B merge into the duct 50C, and the radiator 152 is commonly used for rapid cooling the heaters 12A and 12B. In this Modification Example, since the high-performance radiator 152 is used, the dampers 53A-1 and 53A-2 and the dampers 53B-1 and 53B-2 are opened at the same time, and the heaters 12A and 12B can be rapidly cooled at the same time.

COMPARATIVE EXAMPLE

Figure 10D:
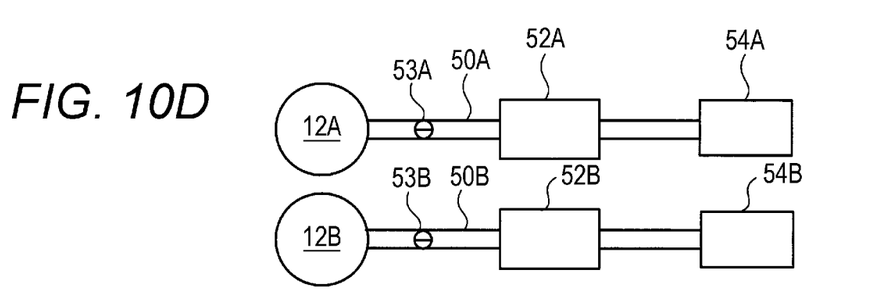
FIG. 10D is a diagram schematically illustrating Comparative Example.

FIG. 10D is a top view schematically illustrating an example of a processing furnace of a substrate processing apparatus according to Comparative Example.

As illustrated in FIG. 10D, ducts 50A and 50B are connected to heaters 12A and 12B, respectively. In addition, in the ducts 50A and 50B, radiators 52A and 52B and exhaust blowers 54A and 54B are disposed, respectively. In addition, on upstream sides of the radiators 52A and 52B in the middle of the ducts 50A and 50B, dampers 53A and 53B having variable opening degrees are disposed, respectively. That is, each of the heaters 12A and 12B includes a radiator 52 and an exhaust blower 54.

That is, according to the present embodiment and Modification Examples, since the number of parts is smaller than that of Comparative Example, it is possible to save space and energy in the substrate processing apparatus.

According to the present embodiment, the following one or more effects can be obtained.

1) It is possible to achieve contradictory conditions for a high throughput and space-saving between a plurality of processing furnaces, and to rapidly reduce the temperature inside the furnace. In particular, the radiator 52 and the exhaust blower 54 can be miniaturized by shifting a progress of a recipe among the plurality of processing modules such that simultaneous rapid cooling from a maximum process temperature does not occur.

2) Since at least one of a radiator and an exhaust blower is shared by the plurality of processing furnaces, space saving and resource saving can be achieved by removing the equipment, the number of inspection points is reduced, and maintenance is also easy.

3) Even if a part or the whole of a rapid cooling period overlaps between the plurality of processing furnaces, rapid cooling can be performed at a determined temperature falling rate, the quality of a film formed on a wafer can be made equivalent, and a thermal history of the reaction tube 16 can be made equivalent.

4) By disposing components bisymmetrically about a boundary surface of processing modules as a symmetric plane, it is possible to suppress variations in the quality of film formation between the left and right processing modules. In addition, film formation can be performed on the left and right processing modules under similar conditions, and the quality of the film formation can be made uniform. Therefore, productivity can be improved. Furthermore, by disposing ducts and dampers connected to processing modules bisymmetrically about a duct into which these ducts merge, it is possible to suppress variations in the quality of the film formation between the left and right processing modules. In addition, film formation can be performed on the left and right processing modules under similar conditions, and the quality of the film formation can be made uniform. Therefore, productivity can be improved.

According to this present disclosure, even when two processing furnaces are included, space can be saved by removing needed equipment.

What is claimed is:

1. A substrate processing apparatus comprising:
   first and second furnaces in which a substrate is processed;
   a heat exchanger that cools a refrigerant discharged from the first and second furnaces;
   an exhaust blower that sucks the refrigerant discharged from the heat exchanger and sends out the refrigerant to a downstream side;
   first and second flow paths that connect the first and second furnaces, the at least one heat exchanger, and the exhaust blower to each other such that the refrigerant can flow therethrough;
   each of first and second dampers having variable opening degrees disposed upstream from the heat exchanger in the first and second flow paths, respectively; and
   a controller that controls heating and cooling of the first and second furnaces,
wherein the first and second flow paths merge in at least one part of each of the first and second flow paths.

2. The substrate processing apparatus according to claim 1, wherein by adjusting the opening degrees of the first and second dampers, the controller is configured to be controllable such that the first and second furnaces having different temperatures are cooled in parallel by the refrigerant at a common predetermined temperature falling rate.

3. The substrate processing apparatus according to claim 2, wherein
   each of the first and second furnaces includes:
      a heat-generating body disposed inside the furnace by being divided into a plurality of zones;
      a heater temperature sensor that detects a temperature corresponding to a temperature of the furnace or the heat-generating body for each of the zones; and
      a substrate temperature sensor that detects a temperature corresponding to a temperature of the substrate for each of the zones, and
   the controller can control a heat generation amount of the heat-generating body in each of the zones while referring to a detected temperature of the heater temperature sensor such that a detected temperature of the substrate temperature sensor follows a target value, and when the first and second furnaces are cooled, the controller can adjust the opening degrees with reference to the detected temperature of the heater temperature sensor such that the detected temperature of the substrate temperature sensor follows a target value that falls at the predetermined temperature falling rate.

4. The substrate processing apparatus according to claim 2, wherein
   each of the first and second furnaces includes:
      a heat-generating body disposed inside the furnace;
      a heater temperature sensor that detects a temperature corresponding to a temperature of the furnace or the heat-generating body; and
      a substrate temperature sensor that detects a temperature corresponding to a temperature of the substrate, and
   the controller can control a heat generation amount of the heat-generating body while referring to a detected temperature of the heater temperature sensor such that a detected temperature of the substrate temperature sensor follows a target value, and when the first and second furnaces are cooled, the controller can adjust the opening degrees with reference to the detected temperature of the heater temperature sensor such that the detected temperature of the substrate temperature sensor follows a target value that falls at the predetermined temperature falling rate.

5. The substrate processing apparatus according to claim 1, wherein by performing heat processing on the substrate in the first and second furnace bodies at different timings and adjusting the opening degrees of the first and second dampers, the controller can perform control such that the first and second furnace bodies having different temperatures are cooled in parallel by the refrigerant at a common predetermined temperature falling rate.

6. The substrate processing apparatus according to claim 1, further comprising
   a three-way valve that selectively connects the first and second flow paths to the heat exchanger on downstream sides of the first and second dampers such that a refrigerant can flow therethrough, wherein
   the exhaust blower and the heat exchanger are commonly used for cooling the first and second furnaces.

7. The substrate processing apparatus according to claim 1, further comprising: a first loading chamber that temporarily houses a substrate to be carried in and out of the first furnace; and a second loading chamber that temporarily houses a substrate to be carried in and out of the second furnace.

8. The substrate processing apparatus according to claim 7, wherein components in the first furnace and components in the first loading chamber are disposed bisymmetrically with components in the second furnace and components in the second loading chamber, respectively, about an adjacent plane of the first and second loading chambers as a symmetric plane.

9. The substrate processing apparatus according to claim 8, wherein the first flow path and the first damper are disposed bisymmetrically with the second flow path and the second damper, respectively.

10. The substrate processing apparatus according to claim 1, wherein the first flow path and the first damper are disposed bisymmetrically with the second flow path and the second damper, respectively.

11. The substrate processing apparatus according to claim 1, wherein the heat exchanger and the exhaust blower are disposed at substantially the same height toward a rear of the first and second furnaces.

* * * * *